United States Patent
Comment et al.

(10) Patent No.: US 10,520,561 B2
(45) Date of Patent: Dec. 31, 2019

(54) SYSTEM AND METHOD FOR HYPERPOLARIZING A SUBSTANCE AND QUENCHING RADICALS THEREIN

(71) Applicants: GENERAL ELECTRIC COMPANY, Schenectady, NY (US); MEMORIAL SLOAN KETTERING CANCER CENTER, New York, NY (US)

(72) Inventors: Arnaud Comment, Cambridge (GB); Albert P. Chen, Toronto (CA); Kayvan Rahimi Keshari, New York, NY (US)

(73) Assignees: GENERAL ELECTRIC COMPANY, Schenectady, NY (US); MEMORIAL SLOAN KETTERING CANCER CENTER, New York, NY (US)

( * ) Notice: Subject to any disclaimer, the term of this patent is extended or adjusted under 35 U.S.C. 154(b) by 167 days.

(21) Appl. No.: 15/716,607

(22) Filed: Sep. 27, 2017

(65) Prior Publication Data
US 2019/0094316 A1 Mar. 28, 2019

(51) Int. Cl.
*G01R 33/28* (2006.01)
*G01R 33/44* (2006.01)

(52) U.S. Cl.
CPC ......... *G01R 33/282* (2013.01); *G01R 33/445* (2013.01); *G01R 33/446* (2013.01)

(58) Field of Classification Search
CPC ... G01R 33/282; G01R 33/445; G01R 33/446
See application file for complete search history.

(56) References Cited

U.S. PATENT DOCUMENTS

| | | | |
|---|---|---|---|
| 5,642,625 A * | 7/1997 | Cates, Jr. | A61K 49/1815 62/55.5 |
| 6,008,644 A | 12/1999 | Leunbach et al. | |
| 6,466,814 B1 | 10/2002 | Ardenkjaer-Larsen et al. | |
| 7,372,274 B2 | 5/2008 | Ardenkjaer-Larsen et al. | |
| 2008/0104966 A1* | 5/2008 | Stautner | F25B 9/14 62/6 |
| 2008/0240998 A1* | 10/2008 | Urbahn | G01N 13/00 422/400 |
| 2008/0278163 A1* | 11/2008 | Hancu | A61B 5/055 324/309 |

(Continued)

OTHER PUBLICATIONS

Capozzi, et al.;Thermal Annihilation of Photo-Induced Radicals Following Dynamic Nuclear Polarization to Product Transportable Frozen Hyperpolarized 13 C-Substrates;Nature Communications;Jun. 1, 2017.

(Continued)

*Primary Examiner* — G. M. A Hyder
(74) *Attorney, Agent, or Firm* — Grogan, Tuccillo & Vanderleeden, LLP (57) ABSTRACT

A system for hyperpolarizing a substance is provided. The system includes a cryostat, a polarizer, and a shuttle. The cryostat is operative to generate radicals within the substance by exposing the substance to electromagnetic radiation. The polarizer is operative to hyperpolarize the substance via the radicals, and to quench the radicals within the substance by adjusting a temperature of the substance after the substance has been hyperpolarized. The shuttle is operative to transport the substance while maintaining hyperpolarization of the substance.

19 Claims, 10 Drawing Sheets (56) References Cited

U.S. PATENT DOCUMENTS

| | | | |
|---|---|---|---|
| 2009/0128147 A1* | 5/2009 | Slade | G01R 33/307 324/309 |
| 2011/0062392 A1* | 3/2011 | Kalechofsky | A61K 49/10 252/582 |
| 2011/0150706 A1* | 6/2011 | Murphy | G01R 33/282 422/105 |
| 2014/0200437 A1* | 7/2014 | Yager | A61B 5/4255 600/420 |
| 2015/0084632 A1* | 3/2015 | Wilhelm | G01R 33/282 324/318 |
| 2015/0091573 A1* | 4/2015 | Skloss | A61B 5/055 324/318 |
| 2016/0033590 A1* | 2/2016 | Eichhorn | G01R 33/282 324/318 |
| 2016/0169998 A1* | 6/2016 | Warren | G01R 33/282 324/309 |

OTHER PUBLICATIONS

Eichhorn, et al.;Hyperpolarization Without Persistent Radicals for In Vivo Real-Time Metabolic Imaging; PNAS; Nov. 5, 2013.

* cited by examiner

SYSTEM AND METHOD FOR HYPERPOLARIZING A SUBSTANCE AND QUENCHING RADICALS THEREIN

BACKGROUND

Technical Field

Embodiments of the invention relate generally to magnetic resonance imaging ("MRI") systems, and more specifically, to a system and method for hyperpolarizing a substance.

Discussion of Art

MRI is a widely accepted and commercially available technique for obtaining digitized visual images representing the internal structure of objects having substantial populations of atomic nuclei that are susceptible to nuclear magnetic resonance ("NMR"). Many MRI systems use superconductive magnets to scan a subject/patient via imposing a strong main magnetic field on the nuclear spins in the subject to be imaged. The nuclear spins are excited by a radio frequency ("RF") signal/pulse transmitted by a RF coil at characteristics NMR (Larmor) frequencies. By spatially disturbing localized magnetic fields surrounding the subject and analyzing the resulting RF responses from the excited nuclear spins as they relax back to their equilibrium state, a map or image of the nuclear spins responses as a function of their spatial location is generated and displayed. An image of the nuclear spins response provides a non-invasive view of a subject's internal structure.

In certain MRI procedures, referred to as Hyperpolarized MRI, e.g., Metabolic MRI, it is sometimes advantageous to inject a subject/patient with a hyperpolarized substance. The term "hyperpolarized," as used herein with respect to a substance, refers to a state of the substance in which the number of nuclear spins of the substance having a polarized state is greater than the number of nuclear spins of the substance having a polarized state at thermal equilibrium conditions. Due to the high percentage of nuclear spins having a polarized state, a hyperpolarized substance may generate an MR signal more than 10,000 times stronger than many non-hyperpolarized substances. Thus, many hyperpolarized substances are effective MRI tracers.

Methods of producing hyperpolarized substances often involve lowering the temperature of a substance in the presence of persistent radicals within a strong magnetic field, and subsequently irradiating the substance and persistent radicals with microwaves. As used herein, the term "persistent radical" refers to an atom and/or molecule that has a free electron and remains within a substance for an indefinite amount of time, and which is not readily removable from the substance without de-hyperpolarizing the substance. Following a Boltzmann distribution, the electron spins of the persistent radicals become highly polarized at low temperature within the strong magnetic field, and the microwaves transfer polarization from the persistent radicals to the nuclear spins of the substance.

Many hyperpolarized substances created by such methods, however, often have short life spans, i.e., the amount of time such substances are in a hyperpolarized state. In particular, the persistent radicals themselves contribute to de-polarization of the substance over time. Accordingly, it is usually necessary to create a hyperpolarized substance at the same location/site at which an MRI procedure utilizing the hyperpolarized substance is performed. Many systems capable of creating hyperpolarized substances, however, are often expensive and/or require a large amount of space. Additionally, it is also usually necessary to create a hyperpolarized substance within a short time period of beginning an MRI procedure which utilizes the hyperpolarized substance. Thus, many systems for creating a hyperpolarized substance are often limited in the number of MRI procedures that they can service in a single day.

What is needed, therefore, is an improved system and method for hyperpolarizing a substance.

BRIEF DESCRIPTION

In an embodiment, a system for hyperpolarizing a substance is provided. The system includes a cryostat, a polarizer, and a shuttle. The cryostat is operative to generate radicals within the substance by exposing the substance to electromagnetic radiation. The polarizer is operative to hyperpolarize the substance via the radicals, and to quench the radicals within the substance by adjusting a temperature of the substance after the substance has been hyperpolarized. The shuttle is operative to transport the substance while maintaining hyperpolarization of the substance.

In another embodiment, a method of hyperpolarizing a substance is provided. The method includes generating radicals within the substance by exposing the substance to electromagnetic radiation while disposed in a cryostat, and hyperpolarizing the substance via the radicals using a polarizer. The method further includes quenching the radicals within the substance by adjusting the temperature of the substance after the substance has been hyperpolarized, and storing the substance within a shuttle operative to facilitate transport of the substance while maintaining hyperpolarization of the substance.

In yet another embodiment, a shuttle for transporting a hyperpolarized substance is provided. The shuttle includes a body having a magnet disposed therein, and a chamber disposed within the body and operative to store the substance. The magnet is operative to generate a magnetic field that maintains the substance in a hyperpolarized state while the body is transported.

In yet still another embodiment, a packet for use in a hyperpolarized magnetic resonance imaging system is provided. The packet includes a hyperpolarized substance that has been quenched of radicals.

DRAWINGS

The present invention will be better understood from reading the following description of non-limiting embodiments, with reference to the attached drawings, wherein below.

DETAILED DESCRIPTION

Reference will be made below in detail to exemplary embodiments of the invention, examples of which are illustrated in the accompanying drawings. Wherever possible, the same reference characters used throughout the drawings refer to the same or like parts, without duplicative description.

As used herein, the terms "substantially," "generally," and "about" indicate conditions within reasonably achievable manufacturing and assembly tolerances, relative to ideal desired conditions suitable for achieving the functional purpose of a component or assembly. As used herein, "electrically coupled", "electrically connected", and "electrical communication" mean that the referenced elements are directly or indirectly connected such that an electrical current may flow from one to the other. The connection may include a direct conductive connection, i.e., without an intervening capacitive, inductive or active element, an inductive connection, a capacitive connection, and/or any other suitable electrical connection. Intervening components may be present.

Further, while the embodiments disclosed herein are described with respect to an MRI system, it is to be understood that embodiments of the present invention may be applicable to other systems and methods which utilize hyperpolarized substances. Further still, as will be appreciated, embodiments of the present invention related imaging systems may be used to analyze tissue generally and are not limited to human tissue.

Figure 1:
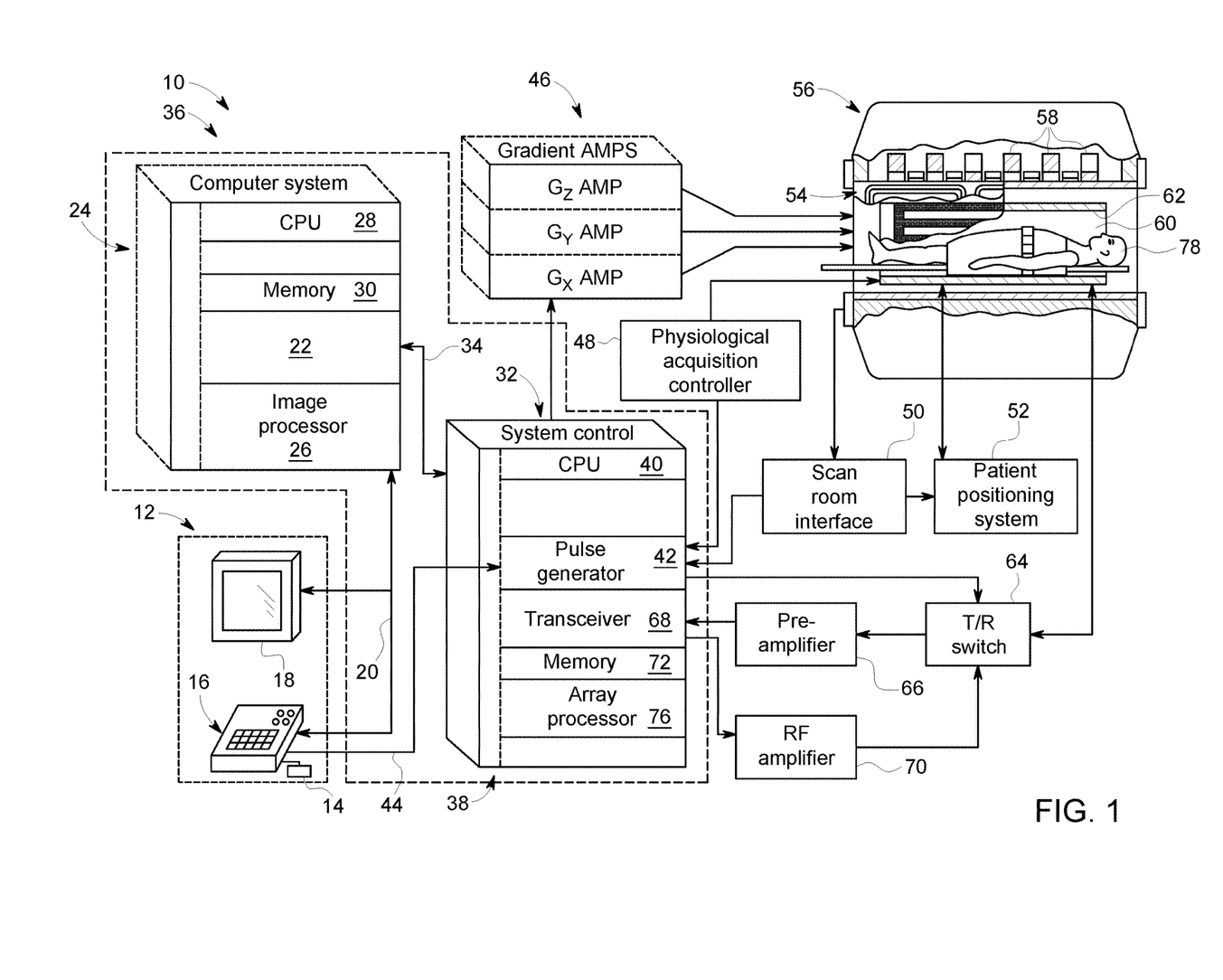
FIG. 1 is a block diagram of an exemplary MRI system, in accordance with an embodiment of the present invention.

Referring now to FIG. 1, the major components of an MRI system 10 incorporating an embodiment of the invention are shown. Operation of the system 10 is controlled from the operator console 12, which includes a keyboard or other input device 14, a control panel 16, and a display screen 18. The console 12 communicates through a link 20 with a separate computer system 22 that enables an operator to control the production and display of images on the display screen 18. The computer system 22 includes a number of modules, which communicate with each other through a backplane 24. These include an image processor module 26, a CPU module 28 and a memory module 30, which may include a frame buffer for storing image data arrays. The computer system 22 communicates with a separate system control or control unit 32 through a high-speed serial link 34. The input device 14 can include a mouse, joystick, keyboard, track ball, touch activated screen, light wand, voice control, or any similar or equivalent input device, and may be used for interactive geometry prescription. The computer system 22 and the MRI system control 32 collectively form an "MRI controller" 36.

The MRI system control 32 includes a set of modules connected together by a backplane 38. These include a CPU module 40 and a pulse generator module 42, which connects to the operator console 12 through a serial link 44. It is through link 44 that the system control 32 receives commands from the operator to indicate the scan sequence that is to be performed. The pulse generator module 42 operates the system components to execute the desired scan sequence and produces data which indicates the timing, strength and shape of the RF pulses produced, and the timing and length of the data acquisition window. The pulse generator module 42 connects to a set of gradient amplifiers 46, to indicate the timing and shape of the gradient pulses that are produced during the scan. The pulse generator module 42 can also receive patient data from a physiological acquisition controller 48 that receives signals from a number of different sensors connected to the patient, such as ECG signals from electrodes attached to the patient. And finally, the pulse generator module 42 connects to a scan room interface circuit 50, which receives signals from various sensors associated with the condition of the patient and the magnet system. It is also through the scan room interface circuit 50 that a patient positioning system 52 receives commands to move the patient to the desired position for the scan.

The pulse generator module 42 operates the gradient amplifiers 46 to achieve desired timing and shape of the gradient pulses that are produced during the scan. The gradient waveforms produced by the pulse generator module 42 are applied to the gradient amplifier system 46 having Gx, Gy, and Gz amplifiers. Each gradient amplifier excites a corresponding physical gradient coil in a gradient coil assembly, generally designated 54, to produce the magnetic field gradients used for spatially encoding acquired signals. The gradient coil assembly 54 forms part of a magnet assembly 56, which also includes a polarizing magnet 58 (which in operation, provides a homogenous longitudinal magnetic field $B_0$ throughout a target volume 60 that is enclosed by the magnet assembly 56) and a whole-body (transmit and receive) RF coil 62 (which, in operation, provides a transverse magnetic field $B_1$ that is generally perpendicular to $B_0$ throughout the target volume 60).

The resulting signals emitted by the excited nuclei in the patient may be sensed by the same RF coil 62 and coupled through the transmit/receive switch 64 to a preamplifier 66. The amplifier MR signals are demodulated, filtered, and digitized in the receiver section of a transceiver 68. The transmit/receive switch 64 is controlled by a signal from the pulse generator module 42 to electrically connect an RF amplifier 70 to the RF coil 62 during the transmit mode and to connect the preamplifier 66 to the RF coil 62 during the receive mode. The transmit/receive switch 64 can also enable a separate RF coil (for example, a surface coil) to be used in either transmit or receive mode.

The MR signals picked up by the RF coil 62 are digitized by the transceiver module 68 and transferred to a memory module 72 in the system control 32. A scan is complete when an array of raw k-space data has been acquired in the memory module 72. This raw k-space data/datum is rearranged into separate k-space data arrays for each image to be reconstructed, and each of these is input to an array processor 76 which operates to Fourier transform the data into an array of image data. This image data is conveyed through the serial link 34 to the computer system 22 where it is stored in memory 30. In response to commands received from the operator console 12, this image data may be archived in long-term storage or it may be further processed by the image processor 26 and conveyed to the operator console 12 and presented on the display 18.

Additionally, while the embodiment of the magnet assembly 56 shown in FIG. 1 utilizes a cylindrical topology in which a patient/subject/object 78 is inserted into the magnet assembly 56, it should be understood that topologies other than cylindrical may be used. For example, a flat geometry in a split-open MRI system may also utilize embodiments of the invention described below.

Figure 2:
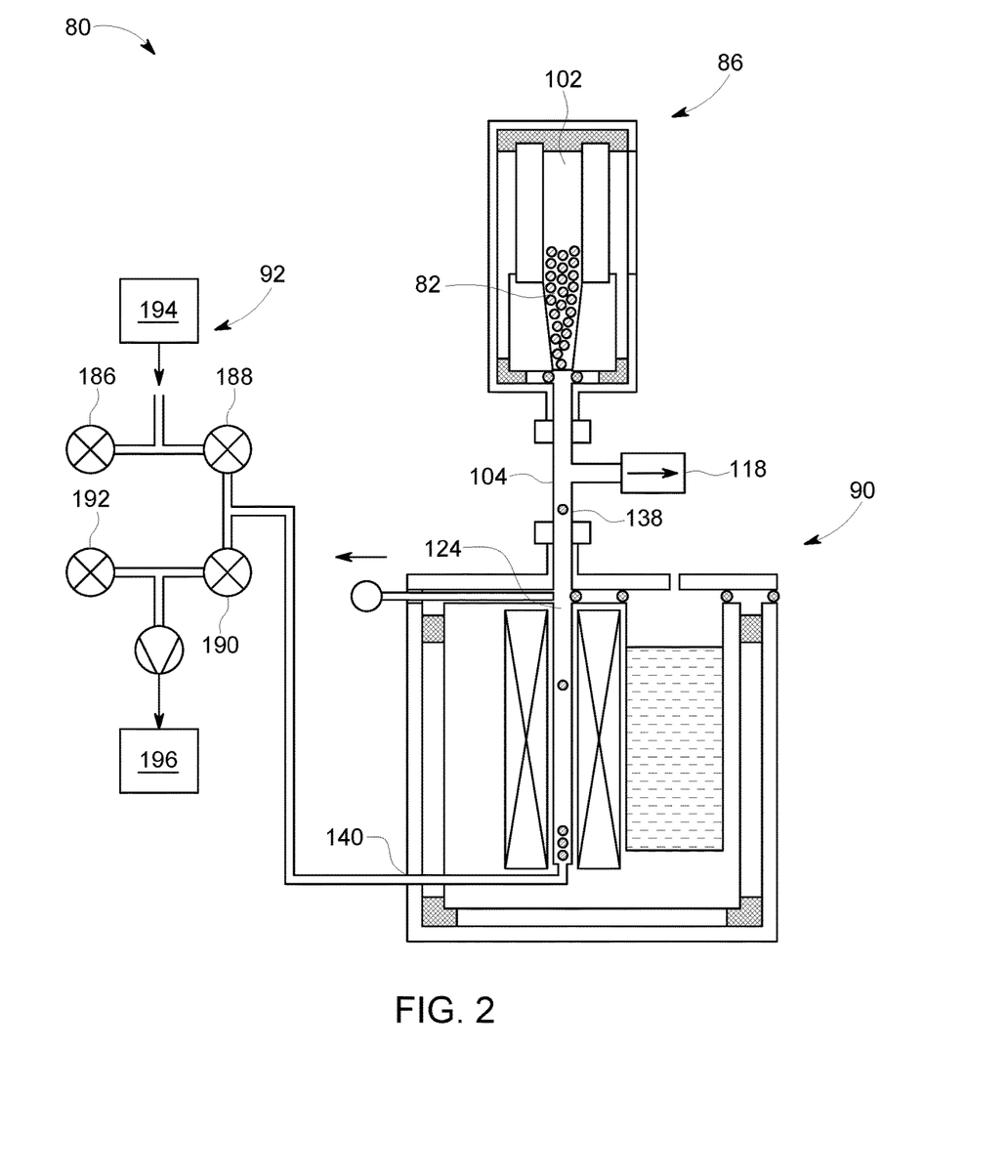
FIG. 2 is a schematic diagram of a cryostat and a shuttle of a system for hyperpolarizing a substance utilized in the MRI system of FIG. 1, in accordance with an embodiment of the present invention.
Figure 3:
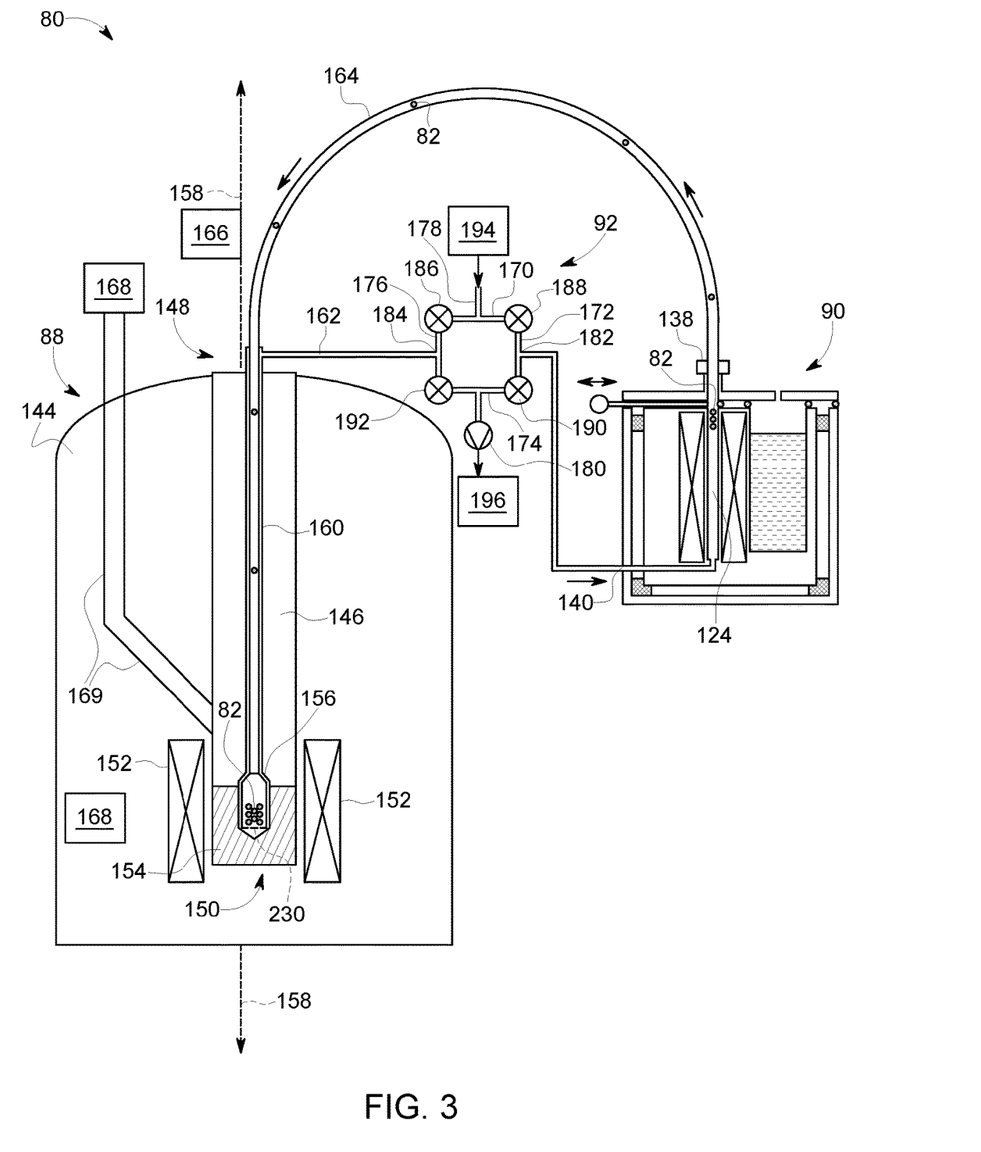
FIG. 3 is a schematic diagram of the shuttle, a polarizer, and an exchange switch of the system for hyperpolarizing a substance of FIG. 2, in accordance with an embodiment of the present invention.

Turning now to FIGS. 2 and 3, a system 80 for hyperpolarizing a substance 82 (FIGS. 2, 3, 4, 6, and 8) and 84 (FIGS. 5, 7, 9, and 10) in accordance with embodiments of the invention is shown. As will be understood, reference numerals 82 and 84 are used herein to respectively indicate the substance as having a non-hyperpolarized or a hyperpolarized state. The system 80 includes a cryostat 86 (FIGS. 2 and 4), a polarizer 88 (FIGS. 3, 8, 9, and 10), e.g., a dynamic nuclear polarizer ("DNP"), and a shuttle 90 (FIGS. 2, 3, 5, 7, 8, 9, and 10). In embodiments, the system 80 may further include an exchange switch 92 (FIGS. 2, 3, 5, 7, 8, 9, and 10), a packet generator 94 (FIG. 6), and/or a dispenser 96 (FIG. 7).

Figure 4:
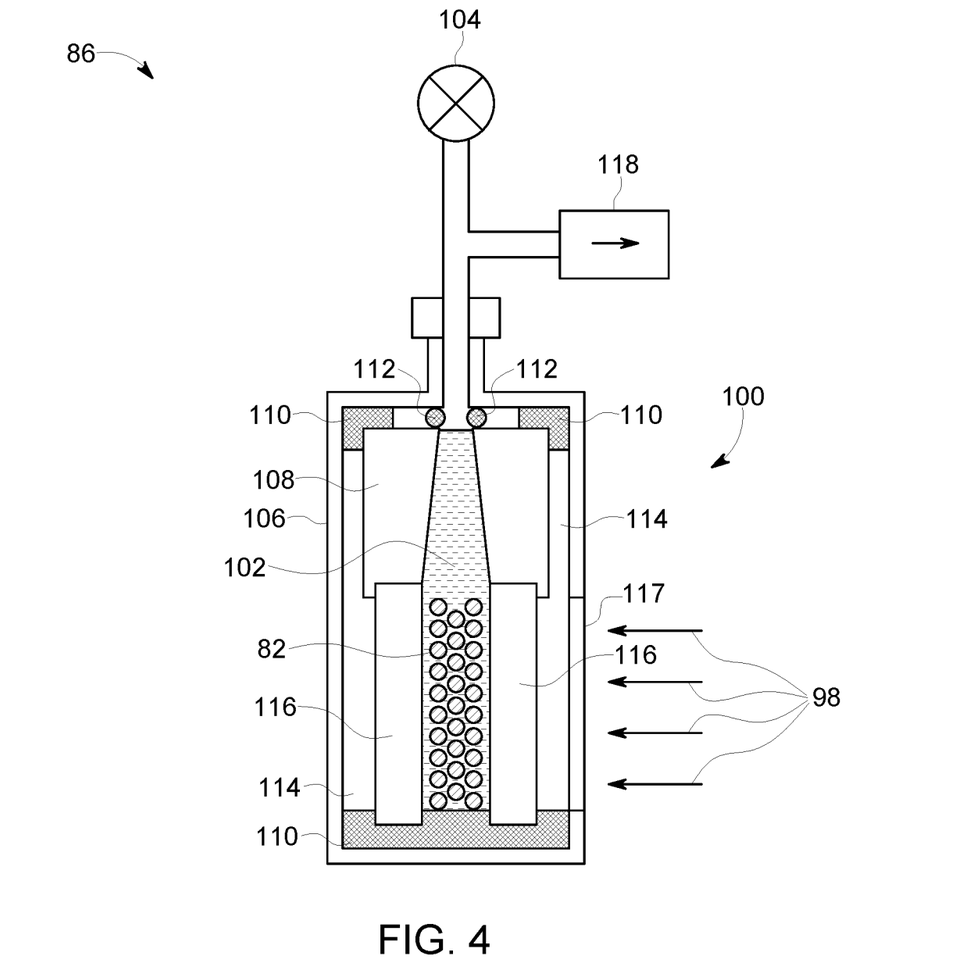
FIG. 4 is another schematic diagram of the cryostat of FIG. 2, in accordance with an embodiment of the present invention.

As shown in FIG. 4, the cryostat 86 is configured to receive the substance 82 in a non-hyperpolarized state and is operative to generate radicals within the substance via exposing the substance 82 to electromagnetic radiation (depicted as arrows 98). The substance 82 may be of any material/chemical/element capable of being hyperpolarized, e.g., carbon thirteen (13) ("$^{13}C$"). In embodiments, the substance 82 may be one or more types of molecules with a photo-reactive triplet state, which may be isotopically enriched at a specific molecular position, admixed to one or more types of molecules of interest, which may also be isotopically enriched at a specific molecular position. In such embodiments, a glassing agent such as DMSO and/or ethanol may be added to the mixtures.

The electromagnetic radiation may be of any frequency capable of generating radicals within the substance 82, e.g., ultraviolet light. Accordingly, in embodiments, the cryostat 86 includes a body 100 that defines a chamber 102 having a selectively sealable opening 104 and operative to retain the substance 82 at a temperate of between about 2K to about 273K. In certain aspects, the body 100 may include an outer body 106 and an inner body 108 spaced apart from the outer body 106 via thermally insulating spacers 110 and/or O-rings 112 so as to form a vacuum 114 between the outer body 106 and the inner body 108. In such embodiments, the chamber 102 may be defined by the inner body 108. As will be appreciated, the spacers 110, O-rings 112, and vacuum 114 insulate the substance 82 within the chamber 102 from the external environment.

As further shown in FIG. 4, the chamber 102 and/or inner body 108 may be partially defined by a material 116, e.g., sapphire, that allows non-thermal electromagnetic radiation 98 to pass through while minimizing the ability of thermal energy to enter the chamber 102 and heat the substance 82. While the embodiments herein depict the outer body 106 as having a window 117, e.g., a quartz window, operative to allow electromagnetic radiation 98 generated from a source external to the cryostat 86 to pass through the outer 106 body, it will be appreciated that the cryostat 86 may include an electromagnetic radiation source, e.g., an ultraviolet light, operative to radiate the substance 82 within the chamber 102. Additionally, the cryostat 86 may include a relief valve 118 operative to vent gas resulting from evaporation of the substance 82/84 while within the chamber 102. In embodiments, the cryostat 86 may be integrated into the shuttle 90.

Figure 5:
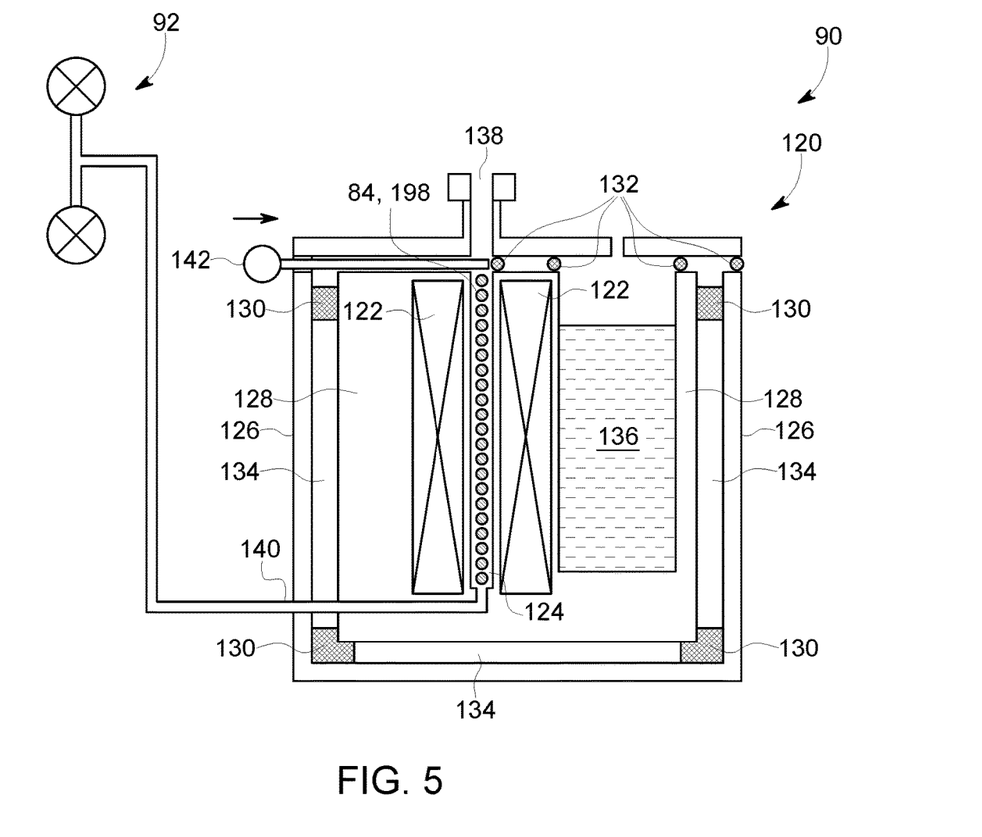
FIG. 5 is another schematic diagram of the shuttle of FIG. 2, in accordance with an embodiment of the present invention.

Moving to FIG. 5, the shuttle 90 is configured to receive the substance 82/84 and to transport the substance while maintaining hyperpolarization of the substance 84. As such, the shuttle 90 includes a body 120 having a magnet 122, e.g., a permanent magnet, resistive magnet, and/or superconductive magnet, disposed therein. The body 120 defines a chamber 124 which is operative to store the substance 82/84. The magnet 122 is operative to generate a magnetic field that maintains the substance 84 in a polarized state while the body 120 is transported.

As will be appreciated, similar to the body 100 of the cryostat 86, the body 120 of the shuttle 90 may include an outer body 126 and an inner body 128 spaced apart from the outer body 126 via thermally insulating spacers 130 and/or O-rings 132 so as to form a vacuum 134 between the outer body 126 and the inner body 128. In such embodiments, the chamber 124 may be defined by the inner body 128. As will be appreciated, the spacers 130, O-rings 132, and vacuum 134 insulate the substance 82/84 within the chamber 124 from the external environment. In embodiments, the shuttle 90 includes a cooling device 136, e.g., a cryogenic liquid containing device (such as a liquid nitrogen tank) and/or a battery powered cryocooler, that keeps the temperature of the substance 82/84 within the chamber 124 at between about 2K to about 273K. As further shown in FIG. 5, the chamber 124 may include one or more selectively sealable openings/ports 138, 140, 142 for fluidly connecting the chamber 124 to the cryostat 86, polarizer 88, exchange switch 92, dispenser 96, and/or other device capable of receiving the substance 82/84.

Returning back to FIG. 3, as will be explained in greater detail below, the polarizer 88 is configured to receive the substance 82, and operative to hyperpolarize the substance 82 via the radicals, and to quench the radicals within the substance 84 via adjusting a temperature of the substance 84 after the substance 84 has been hyperpolarized. The term "quenching," as used herein with respect to radicals in a substance, means to reduce and/or eliminate the number of radicals within the substance by either removing the radicals from the substance and/or allowing the molecules/atoms forming the radicals to chemically bond with adjacent molecules/atoms in the substance such that they no longer have free electrons.

Accordingly, the polarizer 88 includes a body 144 that defines a chamber 146 having a first end 148 and a second end 150 opposite the first end 148. A magnet 152 is disposed within the body 144 so as to generate a magnetic field that encompasses the second end 150. A cooling medium 154, e.g., liquid Helium ("He"), is disposed in the second end 150. The polarizer 88 further includes a container 156 configured to contain the substance 82/84 and selectively moveable along an axis 158 of the chamber 146. In embodiments, the container 156 may be fluidly connected to a conduit 160, which in turn may be fluidly connected to the exchange switch 92 and/or shuttle 90 via conduits 162 and 164, respectively. In certain aspects, the polarizer 88 may include a motor 166 that moves the container 156 and/or conduit 160 along the axis 158. The polarizer 88 may further include a microwave source 168 that emits microwaves that are fed into the chamber 146 through a waveguide 169.

As also shown in FIG. 3, the exchange switch 92 is operative to facilitate movement of the substance 82/84 between the cryostat 86, polarizer 88, shuttle 90, and/or any other device capable of receiving the substance 82/84. In embodiments, the exchange switch 92 may include one or more conduits 170, 172, 174, 176, a transport medium port 178, a vacuum port 180, one or more substance ports 182, 184, and one or more valves 186, 188, 190, 192. The transport medium port 178 is operative to fluidly connect the one or more conduits 170, 172, 174, 176 to a transport medium source 194. The vacuum port 180 is operative to connect the one or more conduits 170, 172, 174, 176 to a vacuum source 196. The one or more substance ports 182 and 184 are operative to fluidly connect the one or more conduits 170, 172, 174, 176 to the cryostat 86, polarizer 88, shuttle 90, and/or any other device capable of receiving the substance 82/84. The one or more valves 186, 188, 190, 192 are operative to fluidly connect the cryostat 86, polarizer 88, shuttle 90, and/or any other device capable of receiving the substance 82/84 to the transport medium source 194 and/or the vacuum source 196.

Figure 6:
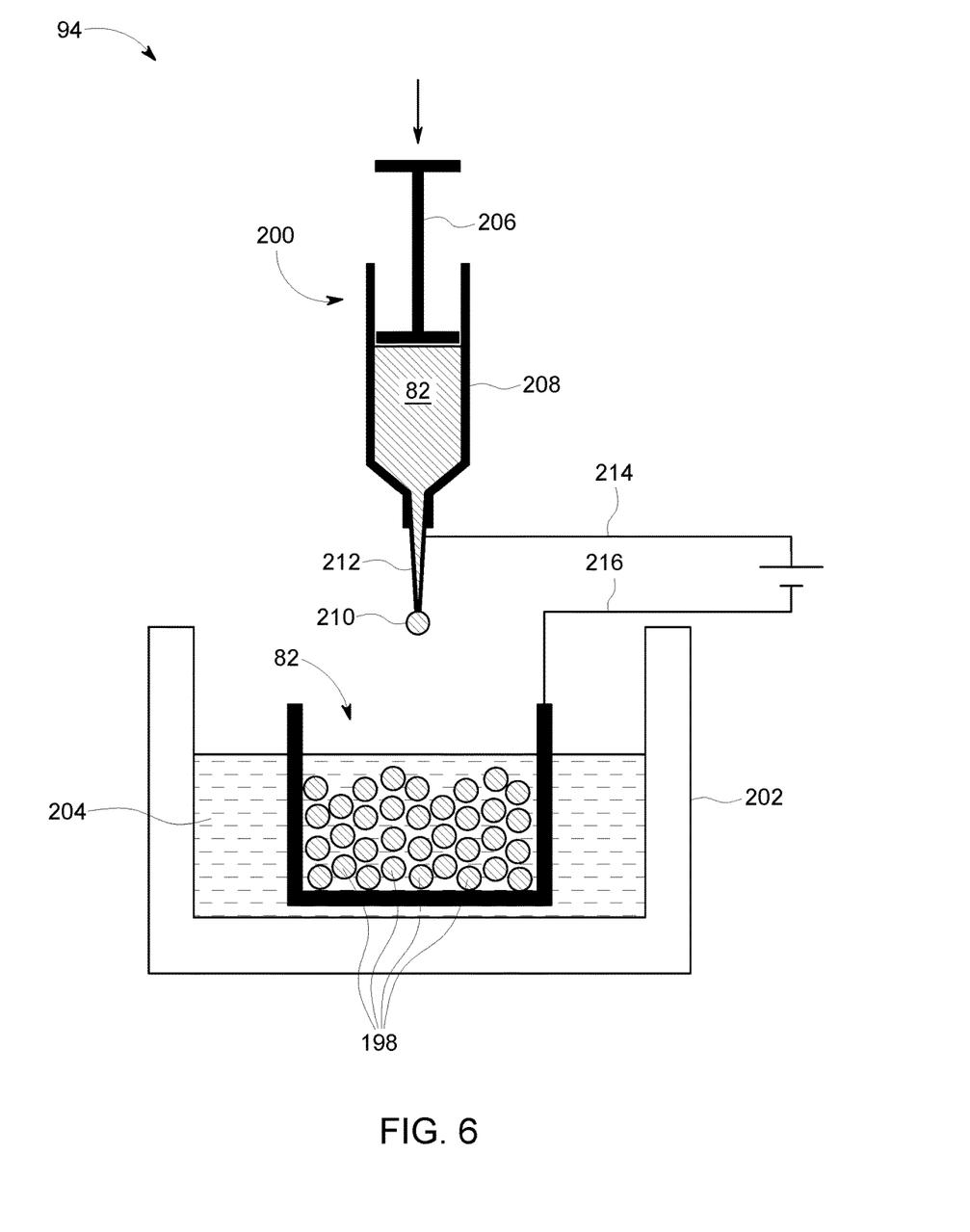
FIG. 6 is a schematic diagram of a packet generator of the system of hyperpolarizing a substance of FIG. 2, in accordance with an embodiment of the present invention.
Figure 7:
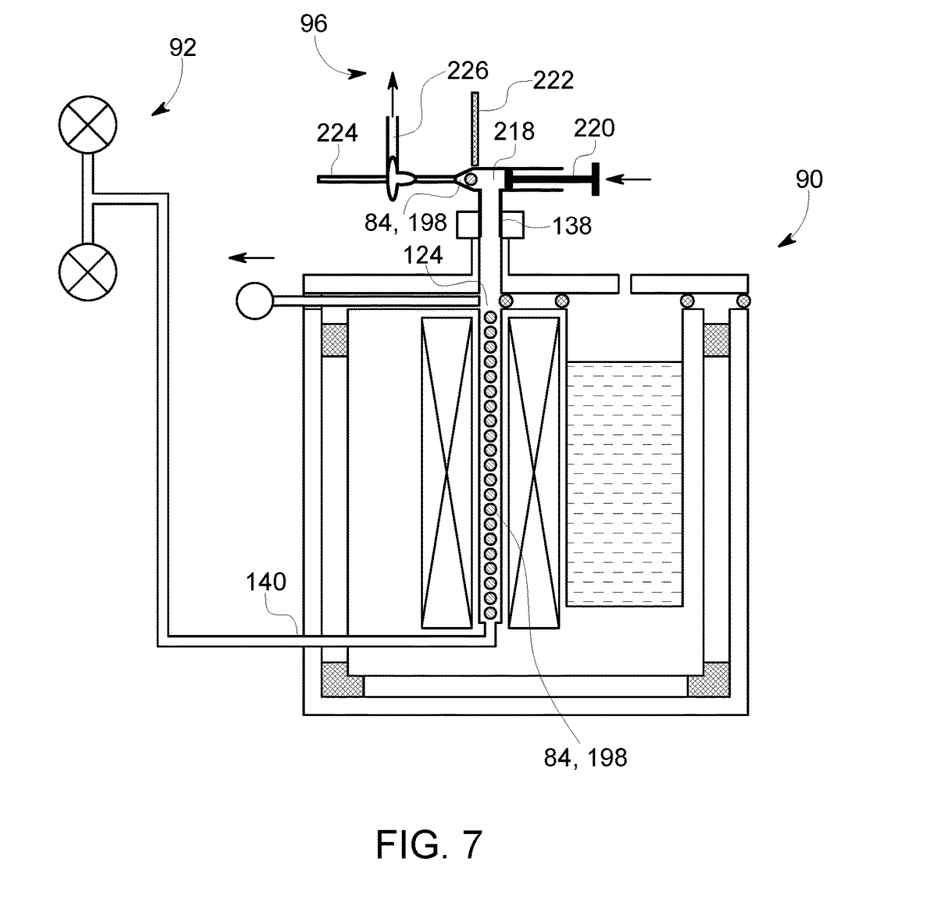
FIG. 7 is a schematic diagram of a dispenser of the system for hyperpolarizing a substance of FIG. 2, in accordance with an embodiment of the present invention.

Referring to FIG. 6, the packet generator 94 is operative to generate packets 198 of the substance 82. The term "packet," as used herein, refers to a discrete amount of the substance which may be transported between the cryostat 86, polarizer 88, shuttle 90, and/or any other device capable of receiving the substance 82/84. As will be appreciated, the packets 198 may have a shape configured to promote complete exposure of the substance 82 to the electromagnetic radiation 98 in the cryostat 86. For example, the packets 198 may be of a bead shape, a sheet, e.g., substantially flat, a cylindrical shape, a quadrangle shape, and/or a triangular shape. Accordingly, as shown in FIG. 6, the packet generator 94 may be an electrostatic bead maker having a dispenser 200 suspended over a tank 202 containing a cooling medium 204, e.g., liquid nitrogen, which may have a temperate of between about 70K to about 273K. The dispenser 200 may be a syringe having a plunger 206 that compresses the substance 82 in liquid form within a chamber 208 so as to produce a small bead/droplet 210 at the tip of a needle end 212. A first voltage may be induced in the droplet 210 via a first wire/catheter needle 214 and a second voltage, opposite the first voltage, may be induced in the tank 202 and/or cooling medium 204 via a second wire/conductive recipient 216.

As will be appreciated, increasing the voltage differential between the droplet 210 and the tank 202/cooling medium 204 creates an attractive force between the droplet 210 and the tank 202, which in turn causes the droplet 210 to leave the needle end 212 and enter the cooling medium 204, whereupon the droplet 210 solidifies into a packet 198. The size of the droplet 210, and in turn the packets 198, may be controlled via the voltage differential, e.g., the lower/higher the voltage differential, the less/more the force on the droplet 210, and the more/less time the droplet 210 has to grow in size before moving from the needle end 212 to the tank 202. In embodiments, the packets 198 may be beads having a diameter of about 2 mm.

Turning now to FIG. 7, the dispenser 96 may be fluidly connected to the shuttle 90 and operative to dispense the substance 84. As such, the dispenser 96 may include a loading chamber 218, a plunger 220, a heating element 222, an outlet 224, and/or a vacuum port 226. The loading chamber 218 may be fluidly connected to the chamber of 124 of the shuttle 90 via port 138.

Referring back to FIG. 6, in operation according to an embodiment, the packet generator 94 may generate/produce packets 198 of the substance 82 in the manner as described above. The packets 198 may then be collected and/or otherwise transferred into the chamber 102 of the cryostat 86 via opening 104 as shown in FIG. 4. Upon loading the substance 82 into the chamber 102, the opening 104 may be sealed so as to maintain the temperature within the chamber 102 sufficiently cold in order to keep the substance 82 in solid form. The substance 82 may then be radiated with electromagnetic radiation 98 so as to form radicals within the substance 82 by breaking chemical bonds between molecules/atoms of the substance 82. As will be appreciated, because of the solid nature of the substance 82 within the cryostat 86, the newly formed radicals are restricted in their movement. As will be understood, the amount of the radicals formed within the substance 82 is proportional to the intensity and/or duration of exposure of the substance 82 to the electromagnetic radiation 98.

As shown in FIG. 2, upon forming a desired amount of radicals within the substance 82, the substance 82 may be transferred from the chamber 102 of the cryostat 86 to the chamber 124 of the shuttle 90 by fluidly connecting port 138 to opening 104, fluidly connecting port 140 to the exchange switch 92, and arranging the valves 186, 188, 190, and 192 such that the chambers 102 and 124 are exposed to the vacuum source 196, which in turn causes the substance 82 to move from chamber 102 to chamber 124. Ports 138 and 140 may be closed upon completion of the transfer of the substance from chamber 102 to chamber 124 so that the substance 82 may be stored and/or transported via the shuttle 90.

Turning to FIG. 3, the substance 82 may then be transferred from the shuttle 90 to the polarizer 88 by fluidly connecting port 138 to the container 156 via conduits 164 and 160, fluidly connecting port 140 and conduit 162 to the exchange switch 92, and arranging the valves 186, 188, 190, 192, such that the chamber 124 is exposed to the transfer medium source 194 while conduits 162 and 164 are exposed to the vacuum source 196. As will be appreciated, the substance 82 is moved from the chamber 124 to the container 156 via conduit 164 by the force of a transfer medium, e.g., gaseous He, flowing through the chamber 124 and conduit 164, in combination with the vacuum created in conduit 162.

Upon receiving the substance 82, the container 156, if not already exposed to/within the cooling medium 154, may be lowered via the motor 166 into the cooling medium 154 so that the substance 82 is cooled while being exposed to the magnetic field created by the magnet 152. As will be appreciated, in embodiments, the container 156 may have a semipermeable inner wall 230 which retains the substance 82/packets 198 while allowing He gas to flow through the container 156 to transfer and/or warm the substance 82/packets 198. In other embodiments, the container 156 may be closed off from the cooling medium 154, i.e., the inner wall 230 may be non-permeable.

Figure 8:
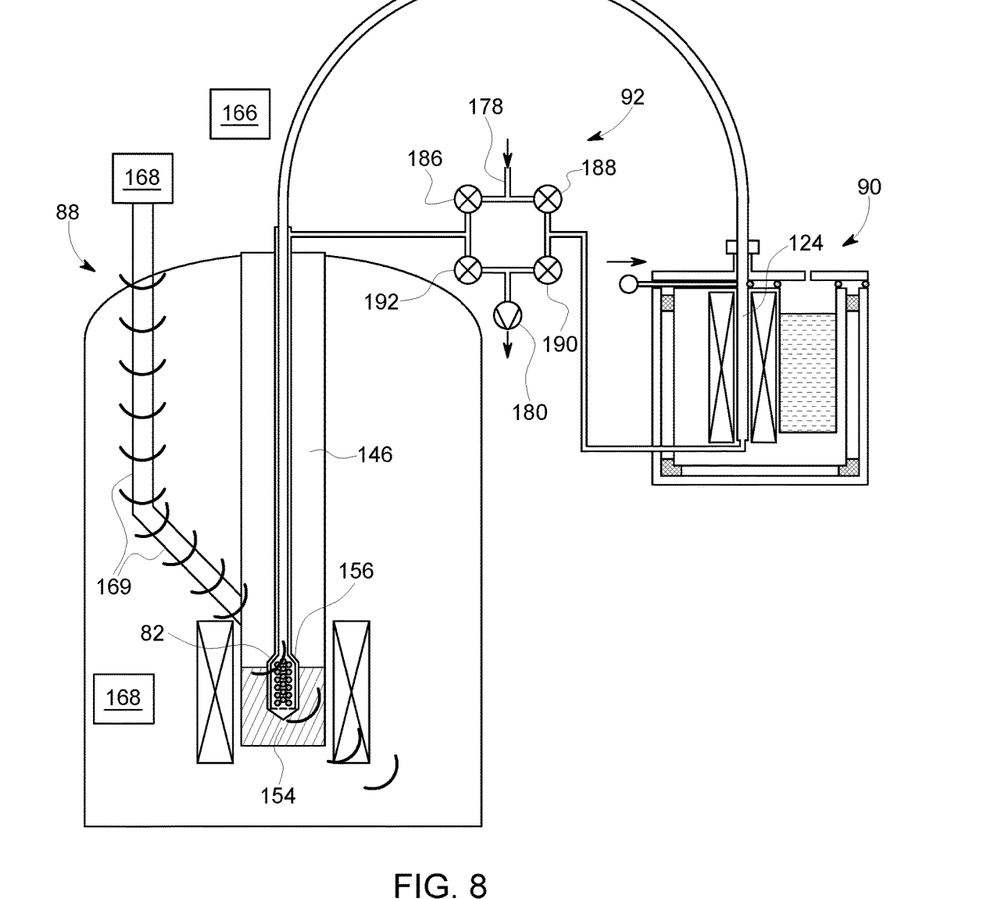
FIG. 8 is another schematic diagram of the shuttle, the polarizer, and the exchange switch of the system for hyperpolarizing a substance of FIG. 2, in accordance with an embodiment of the present invention.

As shown in FIG. 8, the valves 186, 188, 190, 192 of the exchange switch 92 may then be closed upon completion of transfer of the substance from 82 chamber 124 to container 156. The substance 82 may then be hyperpolarized via transferring polarity from the radicals to the molecules/atoms of the substance 82 by transmitting microwaves through the substance 82 via the microwave source 168. In certain aspects, the hyperpolarization of the substance 82 within the polarizer 88 may be monitored via solid state NMR, e.g., the polarizer 88 may include a NMR probe and spectrometer.

Figure 9:
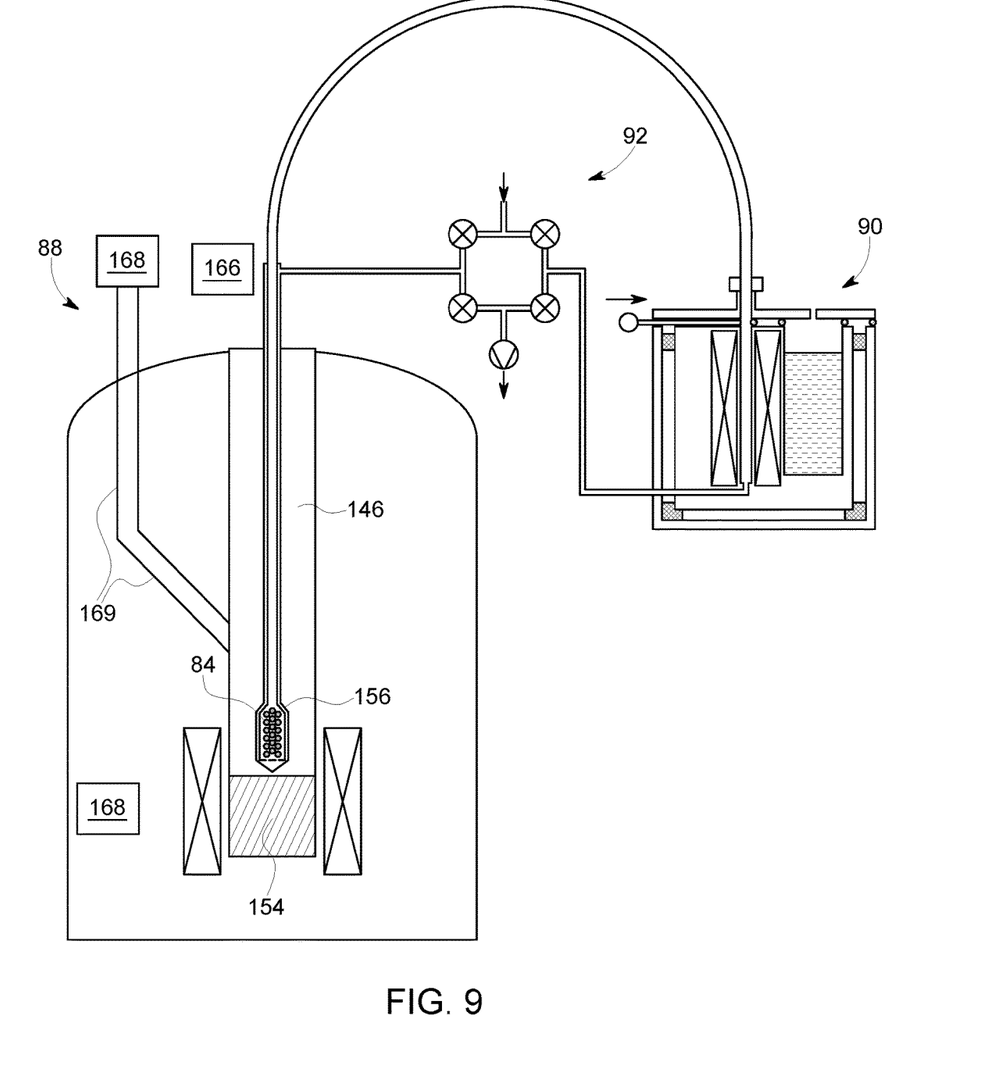
FIG. 9 is yet another schematic diagram of the shuttle, the polarizer, and the exchange switch of the system for hyperpolarizing a substance of FIG. 2, in accordance with an embodiment of the present invention.

As illustrated in FIG. 9, after hyperpolarization of the substance 84, the radicals in the substance 84 may be quenched by adjusting the temperature, e.g., warming the substance 84, to a temperature of between about 70K to about 273K, e.g., 190K, by raising the container 156 out of the cooling medium 154. As will be understood, raising the temperature of the hyperpolarized substance 84 quenches the radicals within the substance 84 by allowing the free electrons of the radicals to bond to nearby molecules. In embodiments, warming of the substance 84 may be accomplished via He gas injected into the container 156.

As will be further appreciated, quenching of the radicals significantly improves the life span of the hyperpolarized substance 84 as the radicals themselves, if left within the substance 84, contribute to de-polarization of the substance 84 over time. For example, embodiments of the present invention may provide for a hyperpolarized substance 84 having a life span that exceeds 16 hours. Upon quenching of the radicals, the substance 84 may be lowered back into the cooling medium 154 and/or subsequently transferred back to the shuttle 90. In embodiments, the substance 84 may be warmed for a period of about 10 seconds or less prior to being cooled back down.

Figure 10:
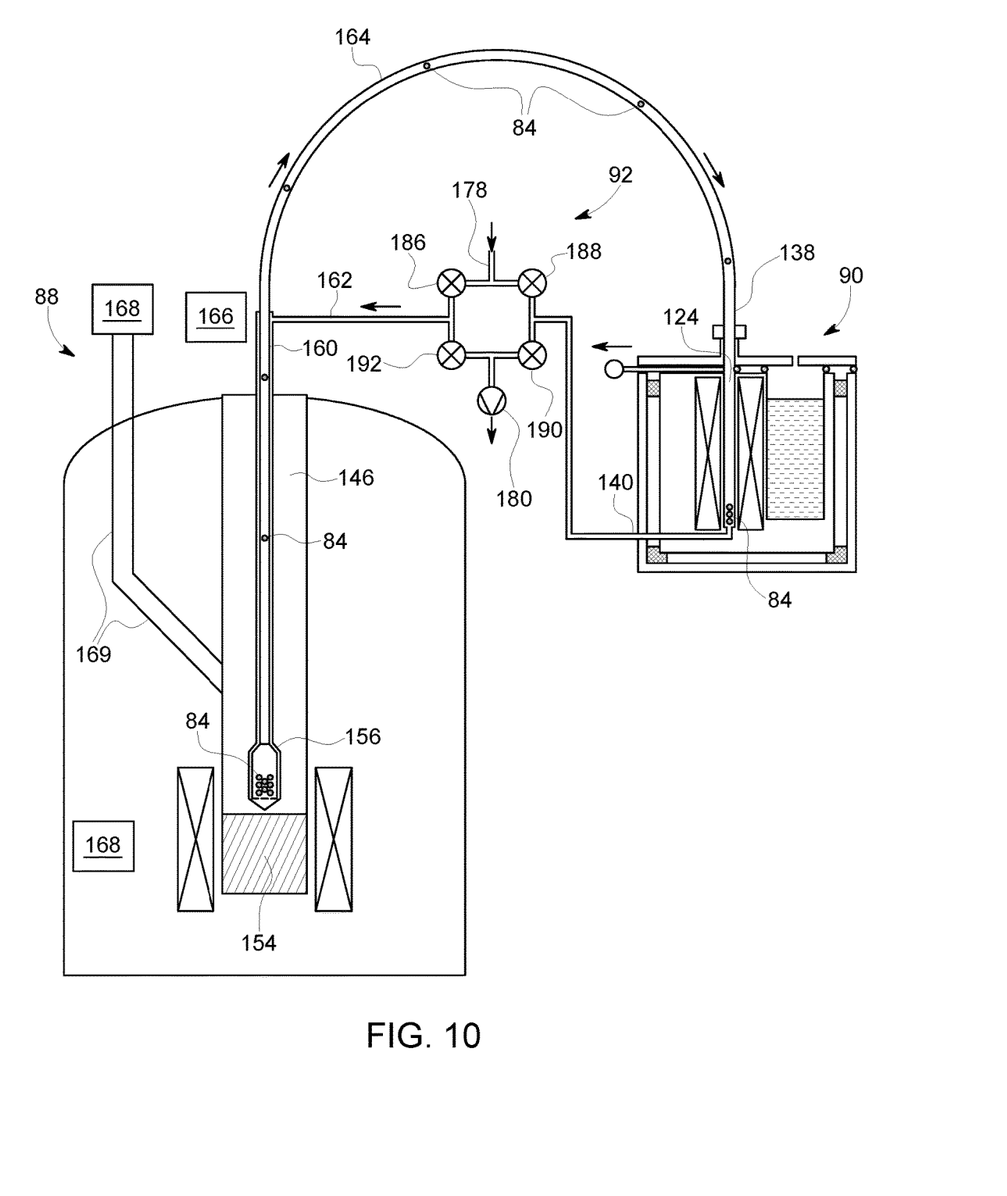
FIG. 10 is still yet another schematic diagram of the shuttle, the polarizer, and the exchange switch of the system for hyperpolarizing a substance of FIG. 2, in accordance with an embodiment of the present invention.

As shown in FIG. 10, transfer of the substance 84 from the container 156 to the chamber 124 may be accomplished by fluidly connecting port 138 to the container 156 via conduits 164 and 160, fluidly connecting port 140 and conduit 162 to the exchange switch 92, and arranging the valves 186, 188, 190, 192 such that the chamber 124 is exposed to the vacuum source 196 while conduits 162 and 164 are exposed to the transfer medium source 194. As will be appreciated, the substance 84 is moved from the container 156 to the chamber 124 via conduits 160 and 164 by the force of a transfer medium, e.g., gaseous He, flowing through conduits 162 and 164, in combination with the vacuum created in the chamber 124. In some embodiments, transfer of the substance 84 from the container 156 to the chamber 124 may be assisted via gas, e.g., He gas, blown from underneath the container 156.

As shown in FIG. 5, the packets 198 of the substance 84 may be stored within the chamber 124 and ports 138 and 140 closed such that the shuttle 90 may be transferred/transported, while the magnet 122 and the cooling device 136 maintain the hyperpolarization of the substance 84. For example, in embodiments, the packets 198 may be generated and hyperpolarized at a manufacturing site and subsequently stored and delivered via the shuttle 90 to a medical site different from the manufacturing site. In embodiments, the packets 198 may be surrounded in liquid He within the chamber 124 during storage and/or transportation.

Moving again to FIG. 7, the hyperpolarized substance 84 may be dispensed from the shuttle 90 for use in the MRI system 10 via the dispenser 96. For example, in embodiments, the dispenser 96 may be fluidly connected to port 138 such that a packet 198 may be loaded into the loading chamber 218 where it may be melted via the heating element 222 into liquid and/or gaseous form so that it can be forced out of the outlet 224 via plunger 220. In embodiments, the heating element 222 may be a LASER operative and/or a microwave generator to rapidly melt the packets 198, and loading of the packets 198 into the chamber 218 may be assisted by gas, e.g., He gas, introduced into the chamber 124 via port 140.

Finally, it is also to be understood that the systems 10 and/or 80 may include the necessary electronics, software, memory, storage, databases, firmware, logic/state machines, microprocessors, communication links, displays or other visual or audio user interfaces, printing devices, and any other input/output interfaces to perform the functions described herein and/or to achieve the results described herein. For example, the systems 10 and/or 80 may include at least one processor and system memory/data storage structures, which may include random access memory (RAM) and read-only memory (ROM). The at least one processor of the systems 10 and/80 may include one or more conventional microprocessors and one or more supplementary co-processors such as math co-processors or the like. The data storage structures discussed herein may include an appropriate combination of magnetic, optical and/or semiconductor memory, and may include, for example, RAM, ROM, flash drive, an optical disc such as a compact disc and/or a hard disk or drive.

Additionally, a software application that adapts the controller to perform the methods disclosed herein may be read into a main memory of the at least one processor from a computer-readable medium. The term "computer-readable medium", as used herein, refers to any medium that provides or participates in providing instructions to the at least one processor of the system 10 and/or 80 (or any other processor of a device described herein) for execution. Such a medium may take many forms, including but not limited to, non-volatile media and volatile media. Non-volatile media include, for example, optical, magnetic, or opto-magnetic disks, such as memory. Volatile media include dynamic random access memory (DRAM), which typically constitutes the main memory. Common forms of computer-readable media include, for example, a floppy disk, a flexible disk, hard disk, magnetic tape, any other magnetic medium, a CD-ROM, DVD, any other optical medium, a RAM, a PROM, an EPROM or EEPROM (electronically erasable programmable read-only memory), a FLASH-EEPROM, any other memory chip or cartridge, or any other medium from which a computer can read.

While in embodiments, the execution of sequences of instructions in the software application causes at least one processor to perform the methods/processes described herein, hard-wired circuitry may be used in place of, or in combination with, software instructions for implementation of the methods/processes of the present invention. Therefore, embodiments of the present invention are not limited to any specific combination of hardware and/or software.

It is further to be understood that the above description is intended to be illustrative, and not restrictive. For example, the above-described embodiments (and/or aspects thereof) may be used in combination with each other. Additionally, many modifications may be made to adapt a particular situation or material to the teachings of the invention without departing from its scope.

For example, in an embodiment, a system for hyperpolarizing a substance is provided. The system includes a cryostat, a polarizer, and a shuttle. The cryostat is operative to generate radicals within the substance by exposing the substance to electromagnetic radiation. The polarizer is operative to hyperpolarize the substance via the radicals, and to quench the radicals within the substance by adjusting a temperature of the substance after the substance has been hyperpolarized. The shuttle is operative to transport the substance while maintaining hyperpolarization of the substance. In certain embodiments, the system further includes an exchange switch operative to facilitate movement of the substance between the cryostat, the polarizer, and the shuttle. In certain embodiments, the exchange switch includes: one or more conduits; a transport medium port operative to fluidly connect the one or more conduits to a transport medium source; a vacuum port operative to fluidly connect the one or more conduits to a vacuum source; one or more substance ports operative to fluidly connect the one or more conduits to at least one of the cryostat, the polarizer, and the shuttle; and one or more valves disposed within the one or more conduits. In such embodiments, the one or more valves are operative to fluidly connect at least one of the cryostat, the polarizer, and the shuttle to at least one of the transport medium source and the vacuum source. In certain embodiments, the cryostat is integrated with the shuttle. In certain embodiments, the electromagnetic radiation is ultraviolet light. In certain embodiments, the system further includes a packet generator operative to generate packets of the substance. In certain embodiments, the packets have a shape configured to promote complete exposure of the substance to the electromagnetic radiation. In certain embodiments, the shape substantially conforms to at least one of a bead, a sheet, a cylinder, a quadrangle, and a triangle. In certain embodiments, the system further includes a dispenser that fluidly connects to the shuttle and is operative to dispense the substance.

Other embodiments provide for a method of hyperpolarizing a substance. The method includes generating radicals within the substance by exposing the substance to electromagnetic radiation while disposed in a cryostat, and hyperpolarizing the substance via the radicals using a polarizer. The method further includes quenching the radicals within the substance by adjusting the temperature of the substance after the substance has been hyperpolarized, and storing the substance within a shuttle operative to facilitate transport of the substance while maintaining hyperpolarization of the substance. In certain embodiments, the method further includes transporting the substance via the shuttle. In certain embodiments, hyperpolarizing the substance via the radicals using a polarizer includes exposing the substance to microwaves. In certain embodiments, the method further includes at least one of: moving the substance between the cryostat and the shuttle via an exchange switch; and moving the substance between the shuttle and the polarizer via the exchange switch. In certain embodiments, the exchange switch facilitates movement of the substance via at least one of a transfer medium and a vacuum. In certain embodiments, the method further includes generating packets of the substance via a packet generator. In certain embodiments, generating packets of the substance via a packet generator includes forming the packets so as to have a shape configured to promote complete exposure of the substance to the electromagnetic radiation. In certain embodiments, the shape substantially conforms to at least one of a bead, a sheet, a cylinder, a quadrangle, and a triangle. In certain embodiments, the method further includes dispensing the substance from the shuttle via a dispenser fluidly connected to the shuttle.

Yet still other embodiments provide for a shuttle for transporting a hyperpolarized substance. The shuttle includes a body having a magnet disposed therein, and a chamber disposed within the body and operative to store the substance. The magnet is operative to generate a magnetic field that maintains the substance in a hyperpolarized state while the body is transported. In certain embodiments, the shuttle further includes an integrated cryostat that is operative to generate radicals in the substance via exposing the substance to electromagnetic radiation.

Yet still other embodiments provide for a packet for use in a hyperpolarized magnetic resonance imaging system. The packet includes a hyperpolarized substance that has been quenched of radicals.

Accordingly, by providing for the storage and transfer of hyperpolarized substances, some embodiments of the invention provide for the ability to mass produce hyperpolarized substances for use in MRI procedures. Additionally, some embodiments may provide for the ability to store hyperpolarized substances onsite at a medical facility well in advance of performing an MRI procedure that utilizes the hyperpolarized substances. Thus, some embodiments of the present invention may reduce the costs associated with certain MRI procedures.

Moreover, by utilizing electromagnetically induced radicals to hyperpolarize a substance, and then thermally quenching the radicals within the substance, some embodiments of the present invention provide for the use of an extended number of molecules within a hyperpolarized MRI system. Thus, some embodiments of the present invention may be used to generate packets for: use in cancer diagnosis and treatment response, e.g., for targeted therapies for enzymatic mutations ("IDH"), and signaling cascades which target metabolism, e.g., $PI_3K$, AKT, mTOR, KRAS; use in heart failure diagnosis and treatment response, e.g., diabetes and fatty liver disease diagnosis and treatment response; use in fundamental characterization of metabolism non-invasively in vivo and in vitro; use in development of novel agents which may target a host of diseases, e.g., receptor targeting; and use in the polarization of novel drugs to interrogate PK/PD in vivo.

Further, the electrostatic process to shape a substance, as described above, may produce highly uniform packets for use in hyperpolarized MRI systems. Thus, some embodiments of the present invention may improve the image quality of hyperpolarized MRI.

Additionally, while the dimensions and types of materials described herein are intended to define the parameters of the invention, they are by no means limiting and are exemplary embodiments. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, terms such as "first," "second," "third," "upper," "lower," "bottom," "top," etc. are used merely as labels, and are not intended to impose numerical or positional requirements on their objects. Further, the limitations of the following claims are not written in means-plus-function format are not intended to be interpreted as such, unless and until such claim limitations expressly use the phrase "means for" followed by a statement of function void of further structure.

This written description uses examples to disclose several embodiments of the invention, including the best mode, and also to enable one of ordinary skill in the art to practice the embodiments of invention, including making and using any devices or systems and performing any incorporated methods. The patentable scope of the invention is defined by the claims, and may include other examples that occur to one of ordinary skill in the art. Such other examples are intended to be within the scope of the claims if they have structural elements that do not differ from the literal language of the claims, or if they include equivalent structural elements with insubstantial differences from the literal languages of the claims.

As used herein, an element or step recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property.

Since certain changes may be made in the above-described invention, without departing from the spirit and scope of the invention herein involved, it is intended that all of the subject matter of the above description shown in the accompanying drawings shall be interpreted merely as examples illustrating the inventive concept herein and shall not be construed as limiting the invention.

What is claimed is:

1. A system for hyperpolarizing a substance comprising:
a cryostat operative to generate radicals within the substance by exposing the substance to electromagnetic radiation;
a polarizer operative to hyperpolarize the substance via the radicals, and to quench the radicals within the substance by adjusting a temperature of the substance after the substance has been hyperpolarized;
a shuttle operative to transport the substance while maintaining hyperpolarization of the substance; and
an exchange switch operative to facilitate movement of the substance between the cryostat, the polarizer, and the shuttle.

2. The system of claim 1, wherein the exchange switch comprises:
one or more conduits;
a transport medium port operative to fluidly connect the one or more conduits to a transport medium source;
a vacuum port operative to fluidly connect the one or more conduits to a vacuum source;
one or more substance ports operative to fluidly connect the one or more conduits to at least one of the cryostat, the polarizer, and the shuttle;
one or more valves disposed within the one or more conduits; and
wherein the one or more valves are operative to fluidly connect at least one of the cryostat, the polarizer, and the shuttle to at least one of the transport medium source and the vacuum source.

3. The system of claim 1, wherein the cryostat is integrated with the shuttle.

4. The system of claim 1, wherein the electromagnetic radiation is ultraviolet light.

5. The system of claim 1 further comprising:
a packet generator operative to generate packets of the substance.

6. The system of claim 5, wherein the packets have a shape configured to promote complete exposure of the substance to the electromagnetic radiation.

7. The system of claim 6, wherein the shape substantially conforms to at least one of a bead, a sheet, a cylinder, a quadrangle, and a triangle.

8. The system of claim 1 further comprising:
a dispenser that fluidly connects to the shuttle and is operative to dispense the substance.

9. A method of hyperpolarizing a substance comprising:
generating radicals within the substance by exposing the substance to electromagnetic radiation while disposed in a cryostat;
moving the substance between the cryostat and a shuttle via an exchange switch;
moving the substance between the shuttle and a polarizer via the exchange switch;
hyperpolarizing the substance via the radicals using the polarizer;
quenching the radicals within the substance by adjusting the temperature of the substance after the substance has been hyperpolarized; and
storing the substance within the shuttle,
wherein the shuttle is operative to facilitate transport of the substance while maintaining hyperpolarization of the substance.

10. The method of claim 9 further comprising:
transporting the substance via the shuttle.

11. The method of claim 9, wherein hyperpolarizing the substance via the radicals using a polarizer comprises:
exposing the substance to microwaves.

12. The method of claim 9, wherein the exchange switch facilitates movement of the substance via at least one of a transfer medium and a vacuum.

13. The method of claim 9 further comprising:
generating packets of the substance via a packet generator.

14. The method of claim 13, wherein generating packets of the substance via a packet generator comprises:
forming the packets so as to have a shape configured to promote complete exposure of the substance to the electromagnetic radiation.

15. The method of claim 14, wherein the shape substantially conforms to at least one of a bead, a sheet, a cylinder, a quadrangle, and a triangle.

16. The method of claim 9 further comprising:
dispensing the substance from the shuttle via a dispenser fluidly connected to the shuttle.

17. A shuttle for transporting a hyperpolarized substance comprising:
a body having a magnet disposed therein;
a chamber disposed within the body and operative to store the substance; and
an integrated cryostat that is operative to generate radicals in the substance via exposing the substance to electromagnetic radiation;
wherein the magnet is operative to generate a magnetic field that maintains the substance in a hyperpolarized state.

18. A system for hyperpolarizing a substance comprising:
a packet generator operative to generate packets of the substance;
a cryostat operative to generate radicals within the substance by exposing the substance to electromagnetic radiation;
a polarizer operative to hyperpolarize the substance via the radicals, and to quench the radicals within the substance by adjusting a temperature of the substance after the substance has been hyperpolarized;
a shuttle operative to transport the substance while maintaining hyperpolarization of the substance.

19. A method of hyperpolarizing a substance comprising:
generating packets of the substance via a packet generator;
generating radicals within the substance by exposing the substance to electromagnetic radiation while disposed in a cryostat;
hyperpolarizing the substance via the radicals using a polarizer;
quenching the radicals within the substance by adjusting the temperature of the substance after the substance has been hyperpolarized; and
storing the substance within a shuttle operative to facilitate transport of the substance while maintaining hyperpolarization of the substance.

* * * * *